United States Patent
Chen et al.

(10) Patent No.: US 10,504,766 B2
(45) Date of Patent: Dec. 10, 2019

(54) CARRIER SUBSTRATE ASSEMBLY, AND FABRICATION METHOD OF FLEXIBLE DISPLAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Weitao Chen, Beijing (CN); Junwei Wang, Beijing (CN); Yang Song, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/508,929

(22) PCT Filed: Jul. 1, 2016

(86) PCT No.: PCT/CN2016/088167
§ 371 (c)(1),
(2) Date: Mar. 5, 2017

(87) PCT Pub. No.: WO2017/124700
PCT Pub. Date: Jul. 27, 2017

(65) Prior Publication Data
US 2018/0315636 A1    Nov. 1, 2018

(30) Foreign Application Priority Data
Jan. 21, 2016 (CN) .......................... 2016 1 0041820

(51) Int. Cl.
*H01L 21/683*    (2006.01)
*B32B 37/12*    (2006.01)
(Continued)

(52) U.S. Cl.
CPC .......... *H01L 21/6835* (2013.01); *B32B 3/266* (2013.01); *B32B 37/12* (2013.01);
(Continued)

(58) Field of Classification Search
CPC ..... B32B 37/12; B32B 38/10; B32B 2457/20; B32B 2037/1253; B32B 3/266;
(Continued)

(56) References Cited

U.S. PATENT DOCUMENTS 6,258,429 B1 *  7/2001 Nelson ...................... B44F 1/10
                                                              40/442
2005/0173064 A1 *  8/2005 Miyanari ............ H01L 21/6708
                                                              156/703
(Continued)

FOREIGN PATENT DOCUMENTS

CN      104317074 A      1/2015
CN      105244308 A      1/2016
(Continued)

OTHER PUBLICATIONS

International Search Report and Written Opinion dated Oct. 27, 2016 in PCT/CN2016/088167.
(Continued)

*Primary Examiner* — Patricia L. Nordmeyer
(74) *Attorney, Agent, or Firm* — Syncoda LLC; Feng Ma

(57) ABSTRACT

The present disclosure provides a carrier substrate assembly, and a method of using the carrier substrate assembly, for fabricating a flexible display substrate. The carrier substrate assembly comprises a carrier substrate, which has a central region with a plurality of through-holes and a peripheral region surrounding the central region. The plurality of through-holes are configured to provide passageways for a reaction solution to facilitate separation of the flexible thin film laminated over an upper surface of the carrier substrate
(Continued)

from the carrier substrate during the lifting-off of the flexible thin film.

18 Claims, 5 Drawing Sheets

(51) Int. Cl.
*B32B 38/10* (2006.01)
*B32B 3/26* (2006.01)
*B32B 38/04* (2006.01)
*C08J 11/06* (2006.01)

(52) U.S. Cl.
CPC ...... *B32B 38/10* (2013.01); *B32B 2037/1253* (2013.01); *B32B 2038/047* (2013.01); *B32B 2457/20* (2013.01); *C08J 11/06* (2013.01)

(58) Field of Classification Search
CPC ........... B32B 2038/047; H01L 21/6835; Y10T 428/14; Y10T 428/28; C08J 11/06
See application file for complete search history.

(56) References Cited

U.S. PATENT DOCUMENTS

| | | | | |
|---|---|---|---|---|
| 2006/0286768 | A1* | 12/2006 | Arana | H01L 21/306 438/455 |
| 2007/0224416 | A1* | 9/2007 | Matsubayashi | C09J 7/38 428/343 |
| 2007/0278699 | A1* | 12/2007 | Aksyuk | B81B 7/0006 257/778 |
| 2008/0014439 | A1* | 1/2008 | Bol | H01L 21/6835 428/337 |
| 2009/0165293 | A1* | 7/2009 | Lytle | H01L 21/561 29/825 |
| 2009/0199957 | A1* | 8/2009 | Inao | C09J 5/04 156/154 |
| 2011/0308739 | A1* | 12/2011 | McCutcheon | H01L 21/187 156/766 |
| 2013/0288454 | A1* | 10/2013 | Burggraf | H01L 21/6835 438/460 |
| 2015/0096673 | A1* | 4/2015 | Gambino | H01L 21/6835 156/247 |
| 2017/0373100 | A1 | 12/2017 | Zhao | |

FOREIGN PATENT DOCUMENTS

| | | |
|---|---|---|
| KR | 100647631 B1 | 11/2006 |
| WO | 2016188180 A1 | 12/2016 |

OTHER PUBLICATIONS

2nd Office Action dated Feb. 14, 2018 in CN201610041820.4.
1st Office Action dated Jul. 4, 2017 in CN201610041820.4.
3rdd Office Action dated Jul. 27, 2018 in CN201610041820.4.

* cited by examiner

CARRIER SUBSTRATE ASSEMBLY, AND FABRICATION METHOD OF FLEXIBLE DISPLAY SUBSTRATE

CROSS-REFERENCE TO RELATED APPLICATION

The present application claims priority to Chinese Patent Application No. 201610041820.4, filed on Jan. 21, 2016, the disclosure of which is hereby incorporated by reference in its entirety.

TECHNICAL FIELD

The present disclosure relates generally to the field of display technologies, more specifically to a flexible display technology, and in particular to a carrier substrate assembly, and a method of using the carrier substrate assembly, for the fabrication of a flexible display substrate.

BACKGROUND

A lamination process of flexible thin films can involve a Roll-to-Roll laminating method, or a non-roll-to-roll laminating method.

The carrier substrates employed by the roll-to-roll laminating method are flexible carrier substrates, and the laminating method is to laminate flexible thin films and the flexible carrier substrates by rolling pressing of two rollers. The non-roll-to-roll laminating method usually employs rigid carrier substrates, and the laminating method is to laminate an adhesive layer over the surface of the rigid carrier substrate first, and then to laminate a flexible thin film over the adhesive layer, thereby the flexible thin film and the carrier substrate are bonded together.

The laminated flexible thin film can have a film layer to be patterned deposited thereon, such as an indium tin oxide (ITO) layer. A patterned film can be obtained after the patterning of the film layer.

After the patterning of the film layer that is deposited on the surface of the flexible thin film, the flexible thin film needs to be separated from the carrier substrate, so that subsequent manufacturing processes can be performed. Because in the non-roll-to-roll laminating process, the flexible thin film is bonded with the rigid carrier substrate tightly through an adhesive layer, it is somewhat difficult to lift off the flexible thin film from the rigid carrier substrate.

Existing technologies typically involve directly lifting off the flexible thin film from the adhesive layer by mechanical force, or separating the flexible thin film from the adhesive layer by heating or cooling so as to reduce the adhesion between the two layers. These lift-off methods can easily result in damages and/or wrinkles to the flexible thin film and can cause the patterned film on the surface of the flexible thin film, such as ITO pattern, to crack, adversely affecting the performance of the pattern.

SUMMARY

In order to address the above-mentioned issues associated with lifting-off of flexible thin film in the fabrication of flexible displays, the present disclosure provides a carrier substrate assembly, and a method of using the carrier substrate assembly, for fabricating a flexible display substrate.

In a first aspect, a carrier substrate assembly configured for lamination and subsequent lifting-off of a flexible thin film is provided. The carrier substrate assembly comprises a carrier substrate, which includes a central region with a plurality of through-holes, and a peripheral region surrounding the central region. The plurality of through-holes are configured to provide passageways for a reaction solution to facilitate separation of the flexible thin film laminated over an upper surface of the carrier substrate from the carrier substrate during the lifting-off of the flexible thin film. Herein the flexible thin film can be a flexible display substrate in a flexible display, and the carrier substrate assembly can thus be used for fabricating a flexible display substrate, as primarily covered by this present disclosure. However, this carrier substrate assembly can also be used for fabricating other types of flexible thin film.

In some embodiments, the carrier substrate can comprise a substantially rigid composition, such as glass, and can have a thickness of 1-2 mm. The carrier substrate can be flexible or bendable, can be made of other compositions, and can have a thickness of other values; there are no limitation herein.

The plurality of through-holes can have a distribution density of 0.1-1 holes/cm$^2$.

In some embodiments of the carrier substrate, the two openings of each of the plurality of through-holes can have a same aperture size, which can range 1-5 mm. In some other embodiments, the two openings of each of the plurality of through-holes can have different aperture sizes. In some preferred embodiments, a first opening of each of the plurality of through-holes at the upper surface of the carrier substrate can have a smaller aperture size than a second opening of the each of the plurality of through-holes at a lower surface of the carrier substrate opposing the upper surface of the carrier substrate. The first opening can have an aperture size of 1-5 mm, and the second opening can have an aperture size of 5-10 mm.

The carrier substrate assembly can further include an adhesive layer, which is configured to be disposed between, and to bond, the carrier substrate and the flexible thin film during the lamination of the flexible thin film; is further configured to be capable of being separated from the flexible thin film during the lifting-off of the flexible thin film.

In some of these embodiments, the adhesive layer can comprise a first portion and a second portion, disposed over the central region and the peripheral region of the carrier substrate respectively.

The first portion of the adhesive layer can comprise an adhesive material such as an acrylic pressure-sensitive adhesive, which is configured to have reduced adhesiveness upon reacting with the reaction solution to thereby facilitate separation of the flexible thin film from the carrier substrate after contacting with the reaction solution running through the plurality of through-holes.

The second portion of the adhesive layer can comprise a sealant material, which is configured to become brittle after curing. In some of the embodiments, the sealant material can be a UV-curable adhesive material, and examples as such can include an epoxy resin adhesive and a UV curable agent. In some others of the embodiments, the sealant material can be a heat-curable adhesive material, and examples as such can include an epoxy resin adhesive and a heat-curable agent.

In some embodiments, the carrier substrate assembly can further include a means for preventing a treatment solution in a process for treating the flexible thin film from contacting the adhesive layer through the plurality of through-holes after the lamination and before the lifting-off of the flexible thin film.

The means as described above can comprise a substrate protection film, which is bonded with a lower surface of the carrier substrate and covering each of the plurality of through-holes, and is configured to prevent the treatment solution from contacting the adhesive layer through the plurality of through-holes after the lamination and before the lifting-off of the flexible thin film.

The means as described above can comprise a deformable material, which is arranged to fill each of the plurality of through-holes, and configured to change shapes thereby allowing autonomous closing or opening of the plurality of through-holes under different conditions. The deformable material can change shape in response to different temperatures, and can comprise shape-memory polyurethane resin.

The means as described above can comprise an infiltration film, which is arranged on an inner wall of each of the plurality of through-holes, and is configured such that a contact angle of the treatment solution over surface of the infiltration film is greater than 90° and that a contact angle of the reaction solution over surface of the infiltration film is less than or equal to 90°.

In some embodiments, the carrier substrate assembly can further comprise a flexible protection film, disposed between, and configured to be in direct contact with, the adhesive layer and the flexible thin film.

In a second aspect, a method of fabricating a flexible display substrate using the carrier substrate assembly as described above is provided. The method includes the following steps:

Providing a carrier substrate assembly including a carrier substrate and an adhesive layer, wherein the carrier substrate has a plurality of through-holes, and the adhesive layer is disposed at an upper surface of the carrier substrate and covers the plurality of through-holes; and Laminating a flexible thin film over the carrier substrate assembly such that the flexible thin film is bonded to an upper surface of the adhesive layer.

In some embodiments of the method, the carrier substrate can include a central region having the plurality of through-holes, and a peripheral region surrounding the central region; the adhesive layer comprises a central adhesive layer disposed over the central region; and a sealant layer disposed over the peripheral region and configured to become brittle after curing. The method as such further includes a step of curing the sealant layer.

In some embodiments, the method can further include a step of forming a film layer over the flexible thin film and patterning the film layer.

In some embodiments, prior to the step of forming a film layer over the flexible thin film, the method can further include a step of treating the plurality of through-holes to prevent a treatment solution in the patterning from passing through the plurality of through-holes to come into contact with the central adhesive layer.

The plurality of the through-holes can be treated by bonding a substrate protection film on a lower surface of the carrier substrate to cover each of the plurality of the through-holes.

Alternatively, the plurality of the through-holes can be treated by filling a deformable material in each of the plurality of the through-holes, wherein the deformable material is configured to change shapes thereby allowing autonomous closing or opening of the plurality of through-holes under different conditions.

Alternatively, the plurality of the through-holes can be treated by disposing an infiltration film on an inner wall of each of the plurality of through-holes, wherein the infiltration film is configured such that a contact angle of the treatment solution over surface of the infiltration film is greater than 90°.

In some embodiments of the method, in the step of providing a carrier substrate assembly including a carrier substrate and an adhesive layer, the sealant layer can be formed on the peripheral region of the carrier substrate by marking and drawing, and the central adhesive layer is formed on the central region of the carrier substrate by spaying or dripping.

In some embodiments, after the step of forming a film layer over the flexible thin film and patterning the film layer, the method can further include a step of lifting off the flexible thin film with the patterned film layer from the carrier substrate to form the flexible display substrate.

The step of lifting off the flexible thin film with the patterned film layer from the carrier substrate to form the flexible display substrate can include the following sub-steps:

Performing a deformation treatment to the sealant layer, such that the sealant layer breaks at a contact surface area with the flexible thin film; and Allowing a reaction solution to pass through the through-holes and react with the central adhesive layer, so that the central adhesive layer and the flexible thin film are separated.

In some of the embodiments, the reaction solution in the sub-step of allowing a reaction solution to pass through the through-holes and react with the central adhesive layer can dissolve the central adhesive layer or cause a bonding property of the central adhesive layer to be reduced or disappear.

In some of the embodiments, the sub-step of allowing a reaction solution to pass through the through-holes and react with the central adhesive layer can comprise: immersing the lower surface of the carrier substrate into a container with reaction solution, or wiping repeatedly the lower surface of the carrier substrate with a liquid-absorbing material containing the reaction solution.

In some embodiments of the method, the flexible thin film can include a flexible thin film main body and a flexible protection film. The flexible protection film can be disposed between, and be configured to be in direct contact with, the adhesive layer and the flexible thin film. As such the method can further comprise: removing the flexible protection film from the flexible thin film, and bonding a new flexible protection film with the flexible thin film.

It is noted that the method as described above can also be used for the fabrication of other types of flexible thin films.

In a third aspect, a method of lifting off a flexible thin film from a carrier substrate is provided herein. The method can comprise: curing the sealant layer; fracturing the brittle sealant layer after the curing; passing a reaction solution through the plurality of through-holes to react with the central adhesive layer to thereby facilitate the lifting off; and lifting off the flexible thin film from the central adhesive layer and the sealant layer. In some embodiments, the reaction between the reaction solution and the central adhesive layer comprises a chemical reaction.

Other embodiments and implementations can become apparent in view of the following descriptions and drawings.

BRIEF DESCRIPTION OF DRAWINGS

In order to more clearly illustrate the technical solutions of the present disclosure or the prior art, a brief introduction is provided to the figures used in the present disclosure or the prior art. It is apparent that the drawings described below represent only some embodiments of the present disclosure, and for those of ordinary skill in the art, other drawings can become apparent based on these drawings.

DETAILED DESCRIPTION

Figure 1:
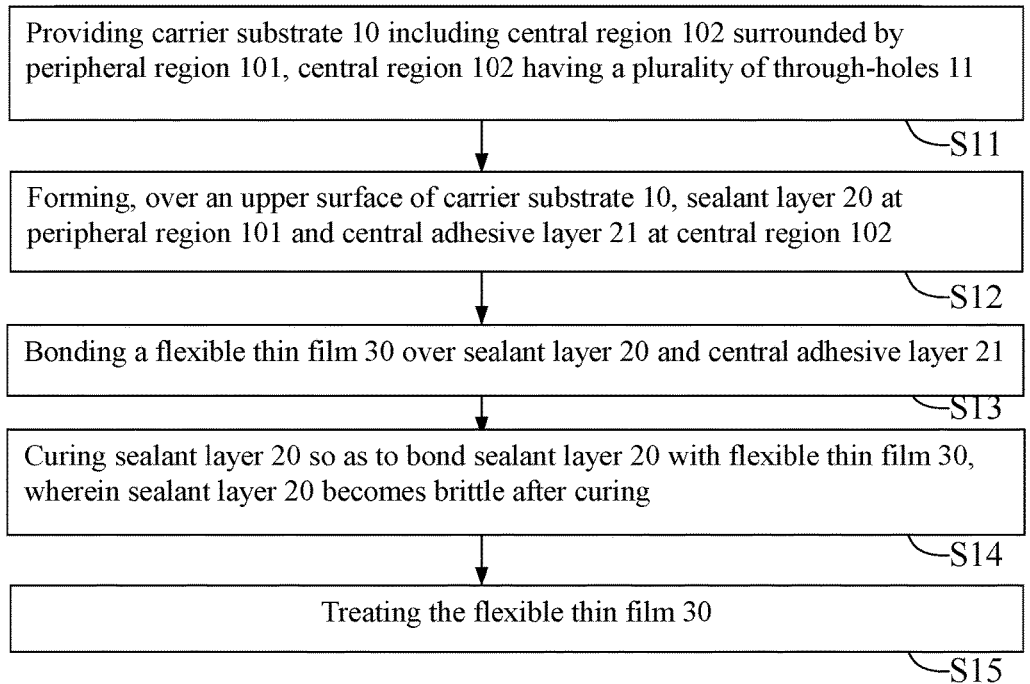
FIG. 1 is a flow chart illustrating a laminating method according to some embodiments of the present disclosure.

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

It should be noted that, unless otherwise defined, all terms used in embodiments of the present disclosure are used (including technical and scientific terms) with the same meaning of what are commonly understood by those with ordinary skill in the art. It should also be understood that, those terms ordinarily defined in dictionary should be interpreted as having the meanings consistent with its meanings in the context of related technologies, rather than interpreting them in an idealized way or in an extreme sense, unless expressly defined so herein.

Additionally, since the size of the through-holes as disclosed herein is very small, for the purpose of clarity, the dimensions of the through-hole in the drawings of the present disclosure are enlarged, and do not represent the actual dimensions or proportions.

Figure 2A:
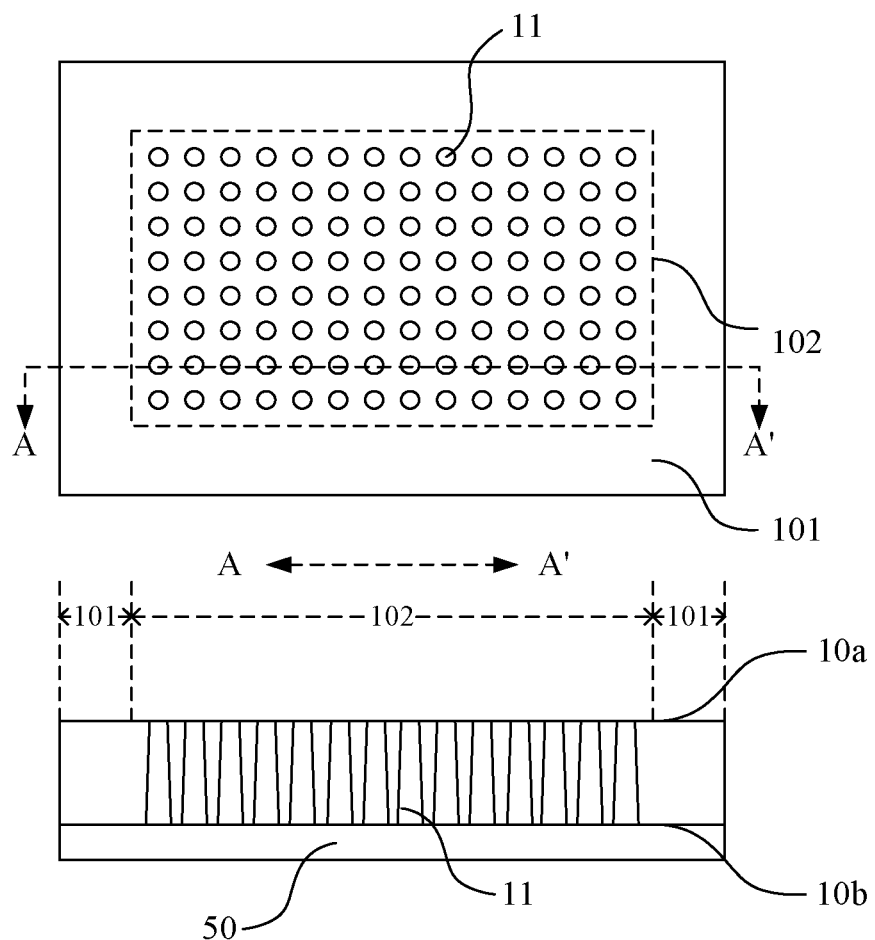
FIG. 2A is a cross-sectional view of a structure corresponding to step S11 in FIG. 1.
Figure 2B:
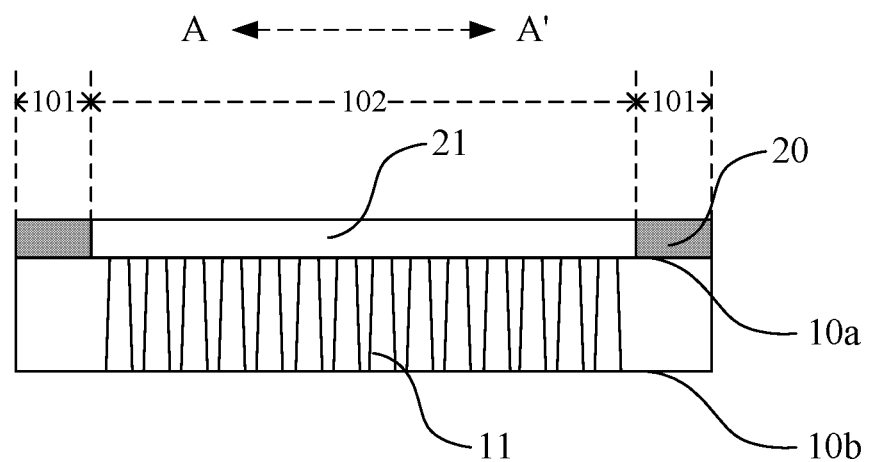
FIG. 2B is a cross-sectional view of a structure corresponding to step S12 in FIG. 1.
Figure 2C:
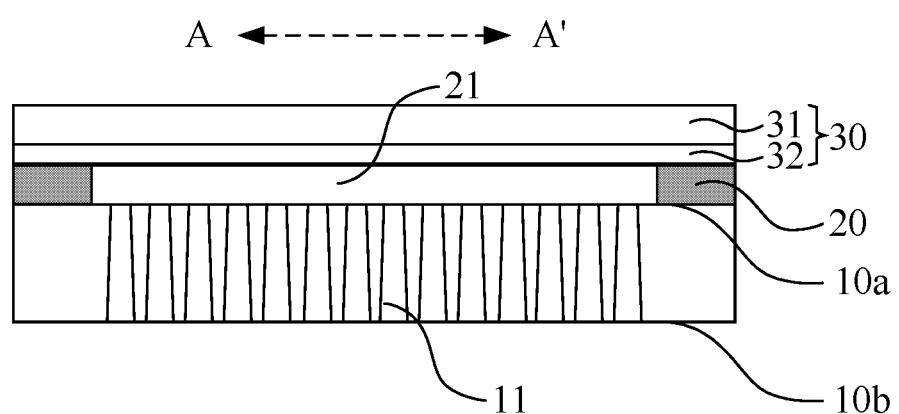
FIG. 2C is a cross-sectional view of a structure corresponding to step S13 in FIG. 1.
Figure 2D:
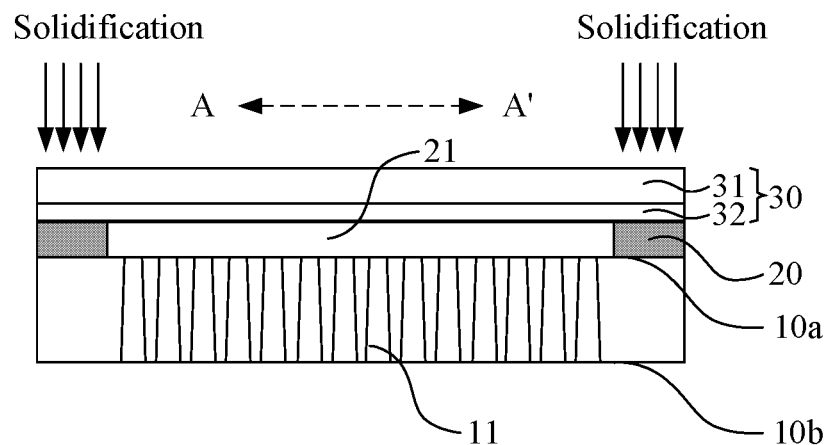
FIG. 2D is a cross-sectional view of a structure corresponding to step S14 in FIG. 1.

The disclosure provides a method for laminating a flexible thin film, as shown in FIG. 1. The method comprises the following steps:

S11. Providing a carrier substrate 10, wherein the carrier substrate 10 comprises a peripheral region 101 and a central region 102, the central region 102 is located inside the peripheral region 102, and the central region 102 is provided with a plurality of through-holes 11, as shown in FIG. 2A;

S12. Fabricating, over an upper surface of the carrier substrate, a sealant layer 20 within the peripheral region 101 and a central adhesive layer 21 within the central region 102, as shown in FIG. 2B;

S13. Laminating a flexible thin film 30 over the sealant layer 20 and the central adhesive layer 21, as shown in FIG. 2C;

S14. Curing the sealant layer 20, so that the sealant layer 20 and the flexible thin film 30 are bonded together, and the sealant layer 20 becomes brittle after being cured, as shown in FIG. 2D.

For the above-described carrier substrate 10, the following should be noted:

First, the upper surface 10a of the carrier substrate 10 means the surface that is close to the bonding side of the flexible thin film 30, and the opposite surface is the lower surface 10b. The terms "upper" and "lower" only illustrate the positional relationship between the two surfaces, and are not limiting the orientation of these two surfaces.

Second, the bonded flexible thin film 30 is arranged over the upper surface 10a of the carrier substrate 10, and in order to ensure the reaction solution to pass through the through-holes 11 to sufficiently react with the central adhesive layer for subsequent lifting off flexible thin film 30 from the adhesive layer, the through-holes 11 arranged within the central region 102 of the carrier substrate 10 are preferably in a form of an array.

The array may be arranged along horizontal and vertical directions crossing each other as shown in FIG. 2A, or may be arranged in an oblique direction crossing each other; there is no limitation herein. The distribution density of through-holes 11 is ranged from 0.1 to 1 holes/cm$^2$, in order to ensure the reaction solution in subsequent processes can go through through-holes 11 to sufficiently come into contact with the central adhesive layer 21.

Third, the cross-section of the through-holes 11 is not limited to circles as shown in FIG. 2A, and can also be oval, rectangular, or other irregular shapes. Considering the process for preparing circular holes is the simplest, the cross-section of through-holes 11 is preferably circular.

The aperture size of the through-holes 11 can be flexibly adjusted depending on parameters such as the size of carrier substrate 10, and this disclosure does not set limitations on this. If the aperture size of the through-holes 11 is too large, the central adhesive layer 21 formed within the central region 102 over the carrier substrate 10 may be filled inside, and thus may block, some of the through-holes 11, causing the reaction solutions in subsequent processes able to only contact part of the central adhesive layer 21 that is filled inside the through-holes 11 and unable to contact with the central adhesive layer 21 in other areas, leading to a difficulty of the central adhesive layer 21 to be separated from the flexible thin film 30. If the aperture size of through-hole is too small, the quantity of the reaction solutions in subsequent processes passing though the through-holes 11 to contact with the central adhesive layer is relatively small, similarly leading to a difficulty of the central adhesive layer 21 to be separated from the flexible thin film 30.

Therefore preferably, if the upper aperture and the lower aperture of the through-holes 11 are configured to have the same size, the range of the aperture size can be 1-5 mm; if the upper aperture of the through-holes 11 over the upper surface 10a of the carrier substrate 10 is smaller than the lower aperture over the lower surface 10b of the carrier substrate 10, the range of the upper aperture size can be 1-5 mm, and the range of the lower aperture size can be 5-10 mm.

FIG. 2A illustrates the through-holes 11 with the configuration as described above, where the upper aperture is smaller than the lower aperture. Due to relatively larger lower apertures, more reaction solutions are able to pass through the through-hole 11 to contact with the central adhesive layer 21; the smaller upper aperture can avoid the central adhesive layer 21 to partially fill, and is trapped inside, the through-holes 11 during the formation process, which may influence the contact between the reaction solutions and the central adhesive layer 21 at other areas.

Fourth, in some embodiments, the carrier substrate 10 is made of glass, and the through-holes 11 can be formed by laser microlithography within the central region 01a2. The laser microlithography technology can ensure that the inner walls of the formed through-holes 11 are smooth and are less prone to have micro-cracks, and can avoid generation of cracks on the carrier substrate 10 due to the existence of a large number of through-holes 11 formed within the central region 01a2, ensuring that the mechanical properties of the glass carrier substrate are not substantially reduced.

Specially treated glass carrier substrate material may also be used in some other embodiments. For example, tempered glass may be employed, so that as many through-holes 11 can be formed by laser micro-lithography over the carrier substrate 10, and the carrier substrate 10 can have adequate mechanical strength and have no issue of micro-cracks.

As for the above-described step S12, the following should be noted:

First, the sealant layer 20 may be formed by a marking and gluing approach within the peripheral region 101. Because the peripheral region 101 substantially surrounds the central region, the sealant layer 20 formed at the peripheral region 101 is correspondingly also substantially surrounds the central adhesive layer, and next by utilizing the sealant layer 20 that has been formed with a thickness, the central adhesive layer 21 may be formed by spraying or dripping within the area framed by the sealant layer 20, i.e., the central region 102.

Herein the central adhesive layer 21 shall be uniformly coated within the central region 01a2, so as to ensure a flat flexible thin film 30 to be subsequently formed.

Second, the sealant layer 20 becomes brittle after being cured, and as such the sealant layer 20 is referred to be a brittle type of adhesives. A brittle material having this characteristics can be broken and damaged even if there is only a small amount of deformation under an external force (such as tension, bending, and impact, etc.). The adhesive of this type can seal the carrier substrate 10 and the flexible thin film 30 well, and can endure the acids, alkali and high temperatures in subsequent patterning processes, but it is prone to fracture resulted from the stress fatigue.

The sealant layer 20 may have a composition of a UV-curable adhesive and/or heat-curable adhesive, and as such the sealant layer 20 may subsequently be UV-cured and/or thermally cured. A UV-curable adhesive may comprise an epoxy resin adhesive (e.g. XN-5A) and a UV curing agent; a heat-curable adhesive may comprise an epoxy resin adhesive (e.g. XN-5A) and a heat-curable agent.

Third, the central adhesive layer 21 is configured to bond with the flexible thin film 30, and can comprise an acrylic pressure-sensitive adhesive in some embodiments. The sealant layer 20 arranged at the peripheral region of the central adhesive layer 21 can make the central adhesive layer 21 to be sealed inside a space between the carrier substrate 10 and the bonded flexible thin film 30, thus ensuring the treatment solution used in subsequent patterning process not to infiltrate from the peripheral regions where the carrier substrate 10 and the flexible thin film 30 are bonded together.

As for the above-described step S13, the bonded flexible thin film 30 may undergo an aging process in advance to prevent, as much as possible, the flexible thin film 30 from deformation as a consequence of subsequent patterning process, or to reduce the degree of deformation of the flexible thin film 30.

Figure 2E:
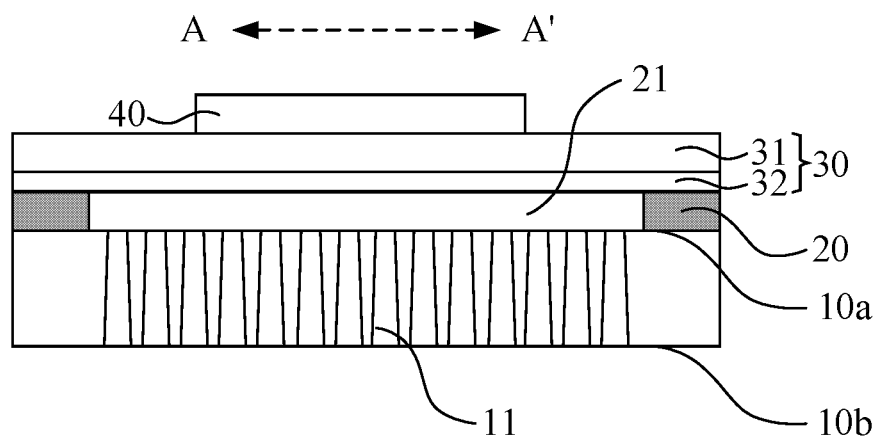
FIG. 2E is a cross-sectional view of a structure corresponding to step S15 in FIG. 1.

On the above basis, the method for laminating a flexible thin film can further comprise:

S15. Treating the flexible thin film 30, wherein the treatment process may involve a modification treatment to the flexible thin film 30, or may involve, as shown in FIG. 2E, a patterning treatment process over the flexible thin film 30 to form a patterned film 40, so as to obtain a flexible display substrate comprising the flexible thin film 30 and the patterned film 40.

As such, in order to avoid the treatment solution to come into contact with the central adhesive layer 21 via the through-holes 11 in subsequent treatment processes, to in turn influence the removal of the central adhesive layer 21 and the lift-off of the flexible thin film 30, the method for laminating a flexible thin film can, before step S15, further comprise:

A step of treating the through-holes 11, so that the treatment solutions used in subsequent processing steps do not pass through the through-holes 11 to come into contact with the central layer 21.

It should be noted that the treatment solution employed in subsequent treatment processes is not a chemical solution that is specifically used to react with, and for removal of, the central adhesive layer 21, which may influence the characteristics of the material in the central adhesive layer 21 after contacting the central adhesive layer 21. This in turn may cause the specific reaction solution used specifically for the central adhesive layer 21 unable to effectively dissolve, or to damage the adhesive/bonding property of, the central adhesive layer 21 after coming into contact with the central adhesive layer 21 in subsequent processes, thus influencing the lift-off of the flexible thin film 30. Thus, treatment of the through-holes 11 need to be performed before step S15, so that the treatment solution employed in subsequent processes will not come into contact with the central adhesive layer 21 through the through-holes 11.

The following three methods can be employed to treat the through-holes 11 to achieve the above-described effects.

Method 1

Bonding a substrate protection film 50 that at least covers the through-holes 11 over the lower surface of the carrier substrate 10 that is far away from the flexible thin film 30, as shown in FIG. 2(a).

The step of bonding a substrate protection layer 50 can be carried out in any steps before step S15, and there are no limitations by the present disclosure.

In some embodiments, the substrate protection film 50 can be an acid/alkali-resistant and high temperature-resistant adhesive tape (e.g., a silicone pressure sensitive adhesive), which can temporarily seal the through-holes 11 during the process of treating the flexible thin film 30 or during the patterning process to form a patterned film over the surface of the flexible thin film 30, so as to avoid the treatment solution in the treatment processes to pass though the through-holes 11 to come into contact with the central adhesive layer 21 disposed over the through-holes 11.

Method 2

Filling a deformable material in the through-holes 11, so that the treatment solution used in the process of subsequent treatment processes will not pass through the through-holes 11 to come into contact with the central adhesive layer 21.

The filling process can be carried out during any steps before step S15. There are no limitations by embodiments of the present disclosure.

A deformable material means a material that can sense and respond to the simulation of changes in temperature and adjust its shape accordingly. A deformable material may comprise a shape-memory polyurethane resin, which can be polymerized with three monomer materials including poly tetramethylene glycol (P1MG), 4,4'-diphenylmethane diisocyanate (MDI) and a chain extension agent.

When temperature changes, the deformable material may fill or expose the through-holes 11, thus achieving autonomous closing or opening of the through-holes 11 under a certain temperature, thereby eliminating the process of bonding and removing the substrate protection film 50 over the lower surface 10b of the carrier substrate 10 in above-described method 1, ultimately leading to a simplified lift-off process in subsequent processes.

Method 3

Forming an infiltration film over the inner wall of the through-holes 11, wherein a contact angle of the treatment solution in treatment process over the surface of the infiltration film is greater than 90°.

The infiltration film can be formed by a corresponding infiltration coating process. The contact angle of the treatment solution over the surface of the infiltration film is greater than 90°, i.e., the treatment solution in the treatment process cannot infiltrate over the surface of the infiltration film, and thus cannot spread out. Thus, even if the through-holes 11 are at OPEN state during the treatment process for the flexible thin film 30, the treatment solution in the treatment process still cannot pass through the through-holes 11 to come into contact with the central adhesive layer 21.

On the above basis, the flexible thin film 30 can comprise a flexible thin film main body 31 and a flexible protection film 32, as shown in FIG. 2 (c), wherein the flexible protection film 32 is in direct contact with both the sealant layer 20 and the central adhesive layer 21, and is configured to protect the flexible thin film main body 31.

The present disclosure also provides a method for lifting off a bonded flexible thin film, whose structure is shown in FIG. 2E: a flexible thin film 30 is arranged over a carrier substrate 10; the carrier substrate 10 comprises a peripheral region 101, and a central region 102, the central region is arranged inside the peripheral region 101; a plurality of through-holes 11 are arranged within the central region 102; an upper surface 10a of the carrier substrate 10 is provided with a sealant layer 20, arranged within peripheral region 101, and a central adhesive layer 21 arranged within the central region 102; the sealant layer 20 becomes brittle after being cured; the flexible thin film 30 is bonded over the sealant layer 20 and the central adhesive layer 21.

Figure 3:
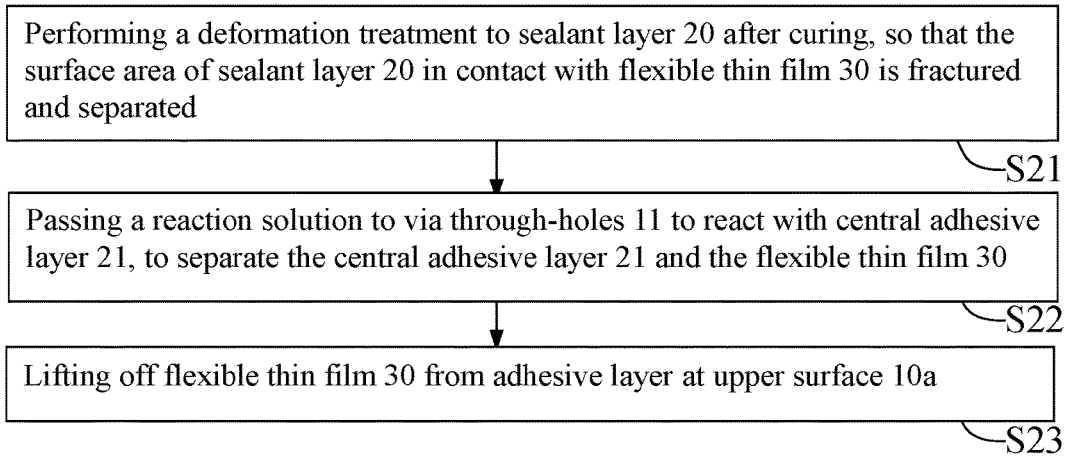
FIG. 3 is a flow chart illustrating a lift-off method according to some embodiments of the present disclosure.
Figure 4:
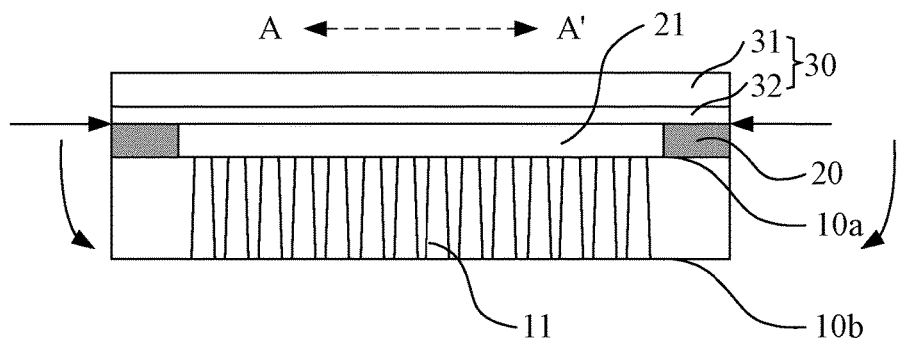
FIG. 4 is a cross-sectional view of a structure corresponding to step S21 in FIG. 3.

As shown in FIG. 3, the method for lifting off a bonded flexible thin film comprises the following steps:

S21. Performing a deformation treatment to the sealant layer 20 after curing, so that the surface area of the sealant layer 20 in contact with the flexible thin film 30 is fractured and separated, as shown in FIG. 4 (the fracture is shown by the horizontal arrows in the figure);

S22. Allowing a reaction solution to pass through the through-holes 11 and react with the central adhesive layer 21, so that the central adhesive layer 21 and the flexible thin film 30 are separated;

S23. Lifting off the flexible thin film 30 from the adhesive layer over the upper surface 10a of the carrier substrate 10.

As for the above-described step S21, the following should be noted:

Deformation treatment is a process in which the sealant layer 20 is deformed after it has been cured so that its contact surface area with the flexible thin film 30 is broken to allow a separation of the flexible thin film 30 from the sealant layer 20. As shown in FIG. 4, for example, the peripheral region 101 of the carrier substrate 10 can be slightly bent through an external force (as shown by the curved arrows in the figure), because the sealant layer 20 has been formed within the peripheral region 101, the sealant layer 20 will also be bent and deformed and fractured accordingly.

Since the peripheral region 101 of the carrier substrate 10 needs to be slightly bent, the thickness of the carrier substrate 10 needs to be as thin as possible while still keeping stable mechanical properties. For example, it can be 1-2 mm.

In step S22 as described above, the central adhesive layer 21 can dissolve after reacting with the reaction solution; or alternatively, the adhesive/bonding property of the central adhesive layer 21 disappears after reacting with the reaction solution.

Accordingly, when the central adhesive layer 21 is dissolved after reacting with the reaction solution, only the sealant layer 20 is left between the flexible thin film 30 and the carrier substrate 10. As such, step S23 involves lifting off the flexible thin film 30 and the sealant layer 20 arranged on the upper surface 10a of the carrier substrate 10. When the adhesive/bonding property of the central adhesive layer disappears after it reacts with the reaction solution, step S23 involves lifting off the flexible thin film 30, the sealant layer 20 arranged on the upper surface 10a of the carrier substrate 10, and the central adhesive layer 21.

The following is a lift-off method according to some embodiments of the present disclosure. First, forming a sealant layer 20 that is brittle after being cured inside a peripheral region 101 of a carrier substrate 10 and forming a central adhesive layer 21 that can be dissolved or its adhesive/bonding property can be removed after reacting with a reaction solution in subsequent processes within a central region 102 of the carrier substrate 10. Next, bonding a flexible thin film 30. After a patterning process over a film disposed over the flexible thin film 30, performing a deformation treatment so as to break and separate a contract surface between the sealant layer 20 and the flexible thin film 30. Then, allowing the reaction solution to react with the central adhesive layer 21 through a plurality of through-holes 11 arranged within the central region 102 of the carrier substrate 10 to separate the central adhesive layer 21 from the bonded flexible thin film 30, such that the flexible thin film 30 is easily separated from the carrier substrate 10. Compared with the direct lift-off method using a mechanical force in existing technologies, this lift-off method as described above significantly reduces the chance that the flexible thin film 30 is damaged. Compared with the heating or cooling methods in existing technologies, this lift-off method as described above reduces the change of stress of the flexible thin film 30 in a lift-off process, and is not easy to produce wrinkles, thereby avoiding the generation of cracks in the patterned film 40 deposited over the surface of the flexible thin film 30 which in turn influences the subsequent application of the patterned film 40. As such, this method has the advantages of high efficiency and high yield.

Additionally, after completion of the aforementioned lift-off process, the carrier substrate 10 can be repeatedly used after cleansing away the remaining reaction solution over the surface of the carrier substrate 10. This feature makes the method more practical.

Since the aforementioned method for laminating the flexible thin film may further comprise a step of treating the through-holes 11, such that the treatment solution used in the treatment of the flexible thin film 30 before carrying out the above lift-off method do not pass through the through-holes 11 to come into contact with the central adhesive layer 21, accordingly, the above-described lift-off method may further comprise: treating the through-holes 11 so as to open the through-holes 11. That is:

With regard to the aforementioned method 1, before performing step S22, the aforementioned lift-off method further comprises: removing the substrate protection film 50 to expose the through-holes 11.

With regard to the aforementioned method 2, before performing step S22, the aforementioned lift-off method further comprises performing heating or cooling treatment to the deformable material filled inside the through-holes 11, so that the shape of the deformable material is changed and the through-holes 11 are exposed.

For example, it may be a heating or cooling treatment to the entire carrier substrate 10, so that the shape of the deformable material filled inside the through-holes 11 may be changed due to the changes in temperature.

When the temperature changes, the deformable material may fill or expose the through-holes 11, thus the through-hole 11 can achieve autonomous closing or opening under certain temperature. Consequently, the process of bonding and removing a substrate protection layer 50 over the lower surface 10b of the carrier substrate 10 can be eliminated, thus simplifying the whole lift-off process.

With regard to the aforementioned method 3, in step S15 of the bonding method, the contact angle of the treatment solution over the surface of the infiltration film disposed over the inner wall of the through-holes 11 is greater than 90°. Accordingly, in step S22 of the lift-off method, the contact angle of the reaction solution over the surface of the infiltration film disposed over the inner wall of through-hole 11 is less than or equal to 90°.

The infiltration film can be formed by a corresponding infiltration coating process. The contact angle of the treatment solution in the treatment process over the surface of the infiltration film is greater than 90°, i.e., the treatment solution in the treatment process cannot infiltrate over the surface of the infiltration film or cannot spread out. Thus, even if the through-holes 11 are at OPEN state during the treatment process of the flexible thin film 30, the treatment solution used in the treatment process still cannot pass through the through-holes 11 to come into contact with the central adhesive layer 21; and the contact angle of the reaction solution over the surface of the infiltration film is less than or equal to 90°, i.e., the reaction solution can infiltrate over the surface of the infiltration film and can spread out, thus the reaction solution can pass through the through-holes 11 to come into contact with the central adhesive layer 21, allowing the separation of the central adhesive layer 21 from the flexible thin film 30 that were boned together.

The aforementioned method 3 utilizes the different infiltration properties of the infiltration film disposed over the inner wall of the through-holes 11 with regards to the treatment solution and the reaction solution, which realizes autonomous opening and closing of the through-holes 11 at different stages of the process, thereby eliminating the process of bonding and removing a substrate protection layer 50 over the lower surface 10b of the carrier substrate 10 in aforementioned method 1, and thus simplifying the entire lift-off process.

Furthermore, the above-described step S22 may specifically be performed with the following methods:

In a first embodiment: immersing the lower surface 10b of the carrier substrate 10 that is far away from the flexible thin film 30 in a vessel containing a reaction solution, which allows the reaction solution to pass through the through-holes 11 to react with the central adhesive layer 21, and thus leading to the separation of the central adhesive layer 21 from the flexible thin film 30.

The depth of immersion of the carrier substrate 10 into the vessel containing the reaction solution shall be picked such that the reaction solution can pass through the through-holes 11 to react sufficiently with the central adhesive layer, and that the reaction solution does not contact with the flexible thin film 30.

The container containing the reaction solution may be, for example, an ultrasonic oscillation shallow groove, so that ultrasonic vibrations accompany the above immersion process, which allows a sufficient contact and reaction of the reaction solution with the central adhesive layer 21.

In a second embodiment: repeatedly wiping the lower surface 10b of the carrier substrate 10 that is far away from the flexible thin film 30 using a liquid-absorbing material containing the reaction solution, to allow the reaction solution to pass through the through-holes 11 to react with the central adhesive layer 21, in turn leading to the separation of the central adhesive layer 21 from the flexible thin film 30.

The liquid-absorbing material comprises a material that has the ability to sufficiently absorb a liquid, for example, it can be a cotton cloth, a sponge, cotton etc.

As shown in FIG. 2C, a flexible thin film 30 can comprise a flexible thin film main body 31 and a flexible protection film 32, wherein the flexible protection film 32 is in direct contact with both the sealant layer 20 and the central adhesive layer 21.

Accordingly, after performing the above-described step S23, the lift-off method may further comprise: removing the flexible protection film 32 in the flexible thin film, and bonding a second flexible protection film 32 to prepare for the subsequent processes.

As such, the present disclosure also provides a carrier substrate 10 that can be applied in the above lift-off method. The through-holes 11 arranged on the carrier substrate 10 may have the following specific features:

The apertures on the two sides of the through-holes 11 can have a same size, ranged 1-5 mm. Alternatively, as shown in FIG. 2(a), the carrier substrate 10 has an upper surface 10a that is close to the bonding side of the flexible thin film, and a lower surface 10b that is opposite to it; the aperture of the through-holes 11 on the upper surface 10a has a less size than the aperture on the lower surface 10b, which have a size of 1-5 mm and of 5-10 mm, respectively.

The distribution density of the through-holes 11 may be, for example, 0.1-1 holes/cm$^2$.

In order to allow the through-holes 11 to autonomously open and close during different steps, a deformable material is filled inside the through-holes 11, and when temperature changes, the shape of the deformable material can change to thereby allow the through-holes 11 to close or open.

Alternatively, an infiltration film can be disposed over the inner wall of the through-holes 11, configured such that the contact angle of the treatment solution used in patterning process over the surface of the infiltration film is greater than 90°, and that the contact angle of the reaction solution over the infiltration film is less than or equal to 90°, so that the through-holes 11 have selective permeability for different solutions.

The carrier substrate 10 can comprise a glass material, and can have a thickness of 1-2 mm.

The present disclosure further provides a method for preparing a flexible display substrate, the method comprises:

S31. Bonding a flexible thin film 30 over a carrier substrate 10 with the aforementioned bonding method;

S32. Forming a film over flexible thin film 30, and treating the film through patterning process to obtain a patterned film 40, as shown in FIG. 2E;

S33. Lifting off the flexible thin film 30 with the patterned film 40 from the carrier substrate 10 through the aforementioned lift-off method, so as to form a flexible display substrate.

The flexible display substrate can be used for display devices, on which patterns such as thin film transistor (TFT) array, and/or pixel electrodes, can be formed. The present disclosure has no specific limitations to the patterned film 40. It can be arranged conveniently according to the specific usages of the flexible display substrate.

The present disclosure further provides a display apparatus, comprising the above-described flexible display substrate. The display device can be, for example, any product or part that has a display function, such as a LCD monitor, a LCD TV, an organic light-emitting display (OLED) panel, an OLED display, an OLED TV, a digital photo frame, a mobile phone, or a tablet PC.

Although specific embodiments have been described above in detail, the description is merely for purposes of illustration and the scope of protection is not limited to the descriptions herein. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures. The scope of protection of present disclosure shall be those claimed in claims of the present disclosure.

The invention claimed is:

1. A carrier substrate assembly configured for lamination and subsequent lifting-off of a flexible thin film, comprising a carrier substrate and the flexible thin film laminated over an upper surface of the carrier substrate, wherein:
   the carrier substrate has a central region with a plurality of through-holes and a peripheral region surrounding the central region;
   the plurality of through-holes provide passageways for a reaction solution to facilitate separation of the flexible thin film laminated over the upper surface of the carrier substrate from the carrier substrate during the lifting-off of the flexible thin film;
   the carrier substrate assembly further comprises an adhesive layer;
   the adhesive layer is disposed between, and bonds, the carrier substrate and the flexible thin film during the lamination of the flexible thin film;
   the adhesive layer is capable of being separated from the flexible thin film during the lifting-off of the flexible thin film;
   the carrier substrate assembly further comprises an infiltration film; and
   the infiltration film is disposed on an inner wall of each of the plurality of through-holes, and has a selective permeability for different solutions such that a treatment solution is blocked from coming into contact with the adhesive layer as a result of a contact angle of the treatment solution over a surface of the infiltration film being greater than 90°, and the reaction solution is capable of infiltrating over the surface of the infiltration film and spreading out, thereby passing through the through-holes and coming into contact with the adhesive layer, as a result of a contact angle of the reaction solution over the surface of the infiltration film being less than or equal to 90°.

2. The carrier substrate assembly according to claim 1, wherein two openings of each of the plurality of through-holes have substantially a same aperture size.

3. The carrier substrate assembly according to claim 1, wherein for each of the plurality of through-holes, a first opening at the upper surface of the carrier substrate has a smaller aperture size than a second opening at a lower surface of the carrier substrate opposing the upper surface of the carrier substrate.

4. The carrier substrate assembly according to claim 1, wherein the adhesive layer comprises a first portion and a second portion, disposed over the central region and the peripheral region of the carrier substrate respectively, wherein:
   the first portion comprises an adhesive material having reduced adhesiveness upon reacting with the reaction solution to thereby facilitate separation of the flexible thin film from the carrier substrate after contacting with the reaction solution running through the plurality of through-holes;
   the second portion comprises a sealant material that becomes brittle after curing.

5. The carrier substrate assembly according to claim 4, wherein the sealant material comprises a UV-curable adhesive material or a heat-curable adhesive material.

6. The carrier substrate assembly according to claim 1, further comprising a substrate protection film, wherein the substrate protection film is bonded with a lower surface of the carrier substrate and covering each of the plurality of through-holes, and prevents a treatment solution from contacting the adhesive layer through the plurality of through-holes.

7. The carrier substrate assembly according to claim 1, further comprising a deformable material, wherein the deformable material fills each of the plurality of through-holes, and changes shapes in response to different temperatures to thereby allow autonomous closing or opening of the plurality of through-holes.

8. The carrier substrate assembly according to claim 1, further comprising a flexible protection film, disposed between, and in direct contact with, the adhesive layer and the flexible thin film.

9. A method of using the carrier substrate assembly according to claim 1, the method comprising:
   providing the carrier substrate assembly including the carrier substrate and an adhesive layer, wherein the adhesive layer is disposed at an upper surface of the carrier substrate and covers the plurality of through-holes; and
   laminating the flexible thin film over the carrier substrate such that the flexible thin film is bonded to an upper surface of the adhesive layer.

10. The method according to claim 9, wherein:
   the carrier substrate includes a central region having the plurality of through-holes and a peripheral region surrounding the central region;
   the adhesive layer comprises a central adhesive layer disposed over the central region and a sealant layer disposed over the peripheral region and that becomes brittle after curing; and
   the method further comprises curing the sealant layer.

11. The method according to claim 10, further comprising a step of forming a film layer over the flexible thin film and patterning the film layer.

12. The method according to claim 11, further comprising, after the step of forming a film layer over the flexible thin film and patterning the film layer, a step of lifting off the flexible thin film with the patterned film layer from the carrier substrate to form the flexible display substrate, comprising sub-steps of:
- performing a deformation treatment to the sealant layer, such that the sealant layer breaks at a contact surface area with the flexible thin film; and
- allowing a reaction solution to pass through the through-holes and react with the central adhesive layer, so that the central adhesive layer and the flexible thin film are separated.

13. The method according to claim 12, wherein the reaction solution in the sub-step of allowing a reaction solution to pass through the through-holes and react with the central adhesive layer dissolves the central adhesive layer or cause a bonding property of the central adhesive layer to disappear.

14. The method according to claim 12, wherein the sub-step of allowing a reaction solution to pass through the through-holes and react with the central adhesive layer comprises:
- immersing the lower surface of the carrier substrate into a container with reaction solution, or
- wiping repeatedly the lower surface of the carrier substrate with a liquid-absorbing material containing the reaction solution.

15. The method according to claim 11, further comprising, prior to the step of forming a film layer over the flexible thin film, treating the plurality of through-holes to prevent a treatment solution in the patterning from passing through the plurality of through-holes to come into contact with the central adhesive layer.

16. The method according to claim 15, wherein the plurality of the through-holes are treated by bonding a substrate protection film on a lower surface of the carrier substrate to cover each of the plurality of the through-holes.

17. The method according to claim 15, wherein the plurality of the through-holes are treated by filling a deformable material in each of the plurality of the through-holes, wherein the deformable material is configured to change shapes in response to different temperatures to thereby allow autonomous closing or opening of the plurality of through-holes.

18. The method according to claim 15, wherein the plurality of the through-holes are treated by disposing an infiltration film on an inner wall of each of the plurality of through-holes, wherein the infiltration film is selectively impermeable to the treatment solution over surface of the infiltration film.

* * * * *